US006943507B2

(12) United States Patent
Winkler et al.

(10) Patent No.: US 6,943,507 B2
(45) Date of Patent: Sep. 13, 2005

(54) DEVICE AND METHOD FOR CONTROLLING FOCUSSED ELECTRON BEAMS

(75) Inventors: Dieter Winkler, Heimstetten (DE); Pavel Adamec, Heimstetten (DE)

(73) Assignee: ICT, Integrated Circuit Testing Gesellschaft für Halbleiterprüttechnik mbH, Heimstetten (DE)

( * ) Notice: Subject to any disclaimer, the term of this patent is extended or adjusted under 35 U.S.C. 154(b) by 0 days.

(21) Appl. No.: 10/474,464

(22) PCT Filed: Apr. 8, 2002

(86) PCT No.: PCT/EP02/03866

§ 371 (c)(1),
(2), (4) Date: Feb. 17, 2004

(87) PCT Pub. No.: WO02/082497

PCT Pub. Date: Oct. 17, 2002

(65) Prior Publication Data

US 2004/0135526 A1 Jul. 15, 2004

(30) Foreign Application Priority Data

Apr. 9, 2001 (EP) ............................................ 01108868

(51) Int. Cl.$^7$ ................................................ H01J 29/52
(52) U.S. Cl. .................... 315/382; 313/495; 250/492.22
(58) Field of Search ................................ 315/106, 107, 315/381, 382; 313/495, 497; 250/398, 492.21, 492.22

(56) References Cited

U.S. PATENT DOCUMENTS 4,833,362 A     5/1989  Crewe ............................ 313/7
5,142,148 A  *  8/1992  Sato ............................ 250/310

(Continued)

FOREIGN PATENT DOCUMENTS

EP      0 434 370 A     6/1991
EP      0 780 879 A     6/1997

OTHER PUBLICATIONS

Chang, T.H.P et al., "Electron–Beam Microcolumns for Lithography and Related Applications", *Journal of Vacuum Science and Technology: Part B*, American Institute of Physics, New York, U.S., vol. 14, No. 6, Nov. 1, 1996, pp. 3774–3781.

Primary Examiner—Tuyet Vo
Assistant Examiner—Jimmy Vu
(74) Attorney, Agent, or Firm—Sughrue Mion, PLLC

(57) ABSTRACT

The invention provides a focussing electron beam device with a single or an array of field emitter beam sources to generate electron beams with field emitter beam sources, at least one anode capable of accelerating the electrons of the electron beams towards a specimen, focussing components capable of focussing the electron beams onto the specimen and a control circuit that a) senses for deviations of the actual current values of the electron beams from desired current values; b) controls first voltages V1 to adjust the actual current values of the electron beams to the desired current values and c) controls second voltages V2 to adjust the actual focus positions of the electron beams to the desired focus positions. The voltage control circuit adjusts the actual current values of the electron beams to the desired current values and makes it possible to adjust the current values of an array of electron beams to a single value. Furthermore, a focussing electron beam device is disclosed with an array of field emitter beam sources integrated onto a substrate, which makes it possible to have arrays of field emitter beam sources with thousands or even millions of field emitter beam sources. With the integration of the control circuits for each field emitter beam source it is possible to adjust the current values and focus positions of each electron beam individually. Furthermore, methods are disclosed describing the operation of a single field emitter beam source or an array of field emitter beam sources.

36 Claims, 11 Drawing Sheets

U.S. PATENT DOCUMENTS

| | | | |
|---|---|---|---|
| 5,717,278 A | 2/1998 | Bartha et al. | 313/336 |
| 5,808,425 A * | 9/1998 | Harle | 315/381 |
| 5,828,163 A | 10/1998 | Jones et al. | 313/336 |
| 5,847,408 A | 12/1998 | Kanemaru et al. | 257/10 |
| 5,929,557 A | 7/1999 | Makishima et al. | 313/309 |
| 5,969,362 A | 10/1999 | Kawata et al. | 250/398 |
| 5,986,388 A | 11/1999 | Makishima | 313/309 |
| 5,990,612 A | 11/1999 | Konuma | 313/495 |
| 6,145,438 A | 11/2000 | Berglund et al. | 101/463.1 |
| 6,667,486 B2 * | 12/2003 | Ohta et al. | 250/492.22 |

* cited by examiner

DEVICE AND METHOD FOR CONTROLLING FOCUSSED ELECTRON BEAMS

FIELD OF THE INVENTION

The invention relates to a focussing electron beam device and to a method to control focussed electron beams. In particular, this invention relates to a focussing electron beam device with focussed electron beams to examine a specimen or to structure the surface of a specimen.

BACKGROUND OF THE INVENTION

Focussed electron beam devices, like e.g. electron microscopes for inspecting specimen or electron beam pattern generators for structuring surfaces of a specimen use electron beams because of their spatial resolution, which can be several orders of magnitude higher than the one of optical light beam devices.

A central part of a focussing electron beam device is the electron beam column which generates the electron beam, accelerates the electrons of the beam to a desired energy and focusses the beam. The electron beam is generated by some kind of electron beam source, accelerated by a voltage between the electron beam source and one or several anodes and focussed by focussing components like e.g. electromagnetic lenses. In addition, an electron beam column can comprise other functional components like e.g. apertures or deflection coils, the latter being a means to scan the focus of the electron beam over an area of interest.

FIG. 1 shows schematically a scanning electron microscope (SEM) with an electron beam column 1—1 as an example of a focussing electron beam device known in the prior art. The schematically drawn electron beam column can also be used for an electron beam pattern generator for structuring the surface of e.g. a mask or a silicon wafer or similar applications. The electron beam column 1—1 in FIG. 1 comprises a field emitter beam source 1-2 with an emitter 1-3 with a sharp emitter tip 1-3a and an extracting electrode 1-4. A $1^{st}$ voltage source 1-7 generates a first voltage V1 between extracting electrode 1-4 and emitter 1-3 that is high enough to enable electrons at the emitter 1-3a to escape into the vacuum 1-0.

The emitted electrons are accelerated towards one of the anodes, i.e. the first anode 1-5, by a second voltage V2 between emitter 1-3 and first anode 1-5. It is generated by the $2^{nd}$ voltage source 1-8. In this electron beam column the first anode 1-5 is placed directly behind the extracting electrode 1-4 to accelerate the electron beam 1-20 to a sufficiently high energy early on in order to minimize lateral spreading of the beam. Due to the opening 1-5a in the first anode 1-5 a significant fraction of the electron beam 1-20 passes by the first anode 1-5 to enter the focussing components. The electron beam first passes the $1^{st}$ electron lens 1-10, then the $1^{st}$ aperture 1-11, then the $2^{nd}$ electron lens 1-12, then the $2^{nd}$ aperture 1-13 and then the scan coils 1-14 which bend the electron beam through the final aperture 1-15 toward a desired focus position on the specimen 1-21. The specimen 1-21 is supported by a second anode 1-26. The voltage of the second anode 1-26 with respect to the emitter 1-3 is part of the set of second voltages V2. It is determined by the sum of the voltages of the $2^{nd}$ voltage source 1-8 and the $3^{rd}$ voltage source 1-9. The scan coils 1-14 enable a scan of the primary electron beam 1-20 over regions of interest of the specimen 1-21. Certainly, many variations of focussing electron beam devices are known in the art.

The electron beam column shown in FIG. 1 is able to focus the electron beam 1-20 with spot sizes smaller than 10 nm. The current sensing unit 1-24 serves to observe the electron beam current. If the field emitter beam source 1-2 has no other connection to ground than voltage reference 1-23, the current going through the current sensing unit 1-24 must, on average, be equal to the electron beam current of the electron beam 1-20 arriving at the specimen.

Also shown in FIG. 1 is a radiation detector 1-22 detecting the secondary particles 1-25 like secondary electrons, backscattered electrons or X-rays, which are generated by the interaction of electron beam 1-20 with the surface of the specimen 1-21. The secondary particles are used to detect and reconstruct an image of the scanned surface of the specimen.

With increasing resolving power of the focussing electron beam device the time for scanning a given area of a specimen for inspection or for structuring the surface increases. Therefore, to maintain or even increase the throughput of specimens in electron beam devices it has been proposed to use electron beam devices with multiple electron beams in parallel.

For a long time, electron beam sources have been used which use thermal excitation for electron emission instead of electric fields at the emitter. Their main advantages were the stable operation even at moderate vacuum ($<10^{-5}$ mbar) and their low costs. However, the ever increasing demand for higher spatial resolution and higher throughput has created an interest into cold field emitter beam sources because of their potentially much smaller source size, higher brightness, smaller energy spread and higher life time. The price to be paid for these advantages are a high operational vacuum ($<10^{-9}$ mbar) and, related to this, problems with the beam current stability. The reason for beam current instabilities is mainly due to the extreme sensitiveness of the electron emission rate to changes of shape and chemical condition of the emitter tip.

The beam current instabilities, however, represent a limitation to imaging resolution or to the homogeneity for structuring the surface of specimens. One solution to the problem of fluctuating electron beam currents is to continually adjust the electron beam currents to the desired current by means of changing the first voltage V1 between emitter and extraction electrode. This, for example, can be realized by replacing the first voltage source by a current source. However, the problem then arises that the electrical potential of the extraction electrode fluctuates, which can deteriorate the focus stability of the electron beam.

Field emitter beam sources have an additional advantage in that they are capable of being integrated onto a semiconductor substrate using micromechanical or microelectronic fabrication techniques. This feature opens up possibilities to miniaturize electron beam columns. Arrays of electron beam columns e.g. can be used to let several electron beams operate in parallel on a specimen in order to increase the throughput for inspecting or structuring a specimen. Such systems have been described e.g. in the U.S. Pat. Nos. 5,969,362 and 6,145,438. In another application many field emitter beam source can be integrated onto a single chip or substrate as described in U.S. Pat. Nos. 5,717,278, 5,828, 163, 5,929,557, and 5,990,612. The field emitter beam sources of such devices can be so densely packed that the array of electron beams can be focussed by one electron beam column. Such electron beam devices, e.g. for structuring the surface of a specimen, offer the combined advantage of high spatial resolution with high throughput.

However, the problem of fluctuating beam currents of field emitter beam sources is even more severe when an array of beams is used. In this case the image or the structure on the surface of the specimen would show artifacts showing regions treated by the individually fluctuating electron beams. Such artifacts would limit the resolution of the image or of the structure on the surface of the specimen.

SUMMARY OF THE INVENTION

The present invention intends to provide an improved focussing electron beam device and method for controlling electron beams. According to one aspect of the present invention, a focussing electron beam device is provided as specified in independent claim 1.

According to a second aspect of the present invention, a focussing electron beam device is provided as specified in independent claim 18.

According to a third aspect of the present invention a method for controlling electron beams is provided as specified in independent claim 19.

According to a fourth aspect of the present invention a method for controlling an array of electron beams is provided as specified in independent claim 36.

Further advantages, features, aspects and details of the invention are evident from the dependent claims, the description and the accompanying drawings. The claims are intended to be understood as a first non-limiting approach of defining the invention in general terms.

Therefore, in a first aspect of the present invention a focussing electron beam device is provided with an electron beam whose actual current value is sensed for deviations from a desired current value and adjusted to a desired current value without sacrificing control of the focus position of the electron beam. In a second aspect of the present invention a focussing electron beam device is provided with an array of electron beams where the actual beam current values of the electron beams can be adjusted to desired current values without sacrificing control of the focus positions. This allows the compensation of focus position shifts of the electron beam caused by changes of the first voltage V1 to stabilize the electron beam current value. Sensing for the deviations of the actual current value from the desired current value, adjusting the first voltage V1 and adjusting the second voltage V2 are preferably automatically performed by the control circuit.

The control circuit according to the invention allows the stability of the current value of the electron beam to be improved while maintaining the focus position. This improvement translates into better spatial resolution for applications like electron microscopy, electron beam pattern generation and the like: for an electron microscope the spatial resolution of images of an specimen can be improved and for an electron beam pattern generator the spatial resolution of structures on specimens like masks or semiconductor wafers can be improved. Furthermore, effects of artifacts in the images or structures of a specimen due to fluctuating electron beam currents or defocussed electron beams can be significantly reduced.

With the use of the control circuit known effects to current instabilities of field emitter beam sources can be compensated. Also, the control circuit according to the invention eases the demands on the vacuum conditions since current fluctuations due to poor vacuum around the emitter can be compensated. A lower vacuum requirement makes the handling of the electron beam devices much easier.

Another advantage of field emitter beam sources is their capability to be integrated onto a substrate with high package density thereby forming an array of field emitter beam sources. The need for automatic stabilization of the current values of multiple electron beams to desired current values is larger, since the individual fluctuations of the current values of the electron beams add up to increase artifact structures in the images of a specimen or in the structures generated on the specimen. Furthermore, with an increasing number of electron beams there is an increasing need to stabilize the current values and the focus positions automatically since manual control becomes impossible.

The term "field emitter beam source" according to the invention is to be understood in a broad sense. The term includes any device which emits electrons from a tip of a solid state body into the vacuum, whereby the emission rate is controlled by an electrical field surrounding the tip of the solid state body. The solid state body, preferably a semiconductor material or a metal, is also called emitter. The electrical field surrounding the tip of the emitter is controlled by the first voltage V1 applied between the emitter and the extraction electrode. The term "field emitter beam source" therefore includes cold field emission beam sources as well as thermal field emission beam sources or Schottky field emission beam sources, the latter two being heated for operation in addition to the applied electrical field.

The extracting electrode is distinguishable from anodes in that it is predominately used to control the electron emission rate rather than to control the direction or energy of the electron beam. Preferably, the extracting electrode is the electrode closest to the tip of the emitter, in which case it can produce, at a given voltage, the largest electric field at the emitter tip. The extracting electrode may also comprise more than one electrode. However, for simplicity of argumentation in this description, an electrode which is marked as extracting electrode is not named anode and vice versa.

For many applications, the electron beam current arriving at a specimen is relevant since there the electron beam is active in probing or structuring possible specimens. However, it is difficult to sense this current or deviations of the current at that location. Therefore, preferably, the deviations of the actual current value from the desired current value are sensed at one of the anodes or in conducting lines carrying the current to be emitted to the emitter.

A specimen generally refers to an object meant as a target of the focussed electron beam for inspection or structuring. For example the specimen can be an object which is being probed by the electron beam for inspection like in an electron microscope. A specimen can also be an object which is being exposed to the focussed electron beam in order to structure the surface of the object like in an electron beam pattern generator. The specimen can also be an object whose interior is to be structured or irradiated like in a medical surgery device. Therefore, specimens in this invention can be e.g. biological, crystalline or other materials that are probed or structured by the focussed electron beam as well as e.g. wafer or masks whose surface is to be structured. It should be noted that the specimen generally is not part of the focussing electron beam device but can be routineously removed from it.

The at least one anode serves to accelerate the electrons of the electron beam towards the specimen. Anodes are electrodes which preferably are at a fixed electrical potential, which influence the direction and energy of the electron beam and which are not extraction electrodes. For simplicity, in this description, the electrical potentials of the anodes are given relative to the potential of the emitter and are denoted as second voltages V2. In one embodiment of the invention the specimen is supported by the only anode. In this embodiment the anode serves to directly accelerate the electrons of the electron beam towards the specimen. However, usually, for performance improvements or due to design constraints there are other electrodes in the electron beam column which are also at fixed electrical potentials and therefore influence direction and energy of the electrons of the electron beam. Those electrodes, in this text, for simplicity of argumentation, are also termed anodes.

The focussing components are capable of focussing the electron beam onto the specimen. Preferably the focussing components are electromagnetic lenses and other elements which serve to focus the electron beam onto the specimen. In one embodiment, the focussing components can be a magnetic field in a direction parallel to the electron beam path and homogeneous in the planes perpendicular to the electron beam. In another embodiment of the invention, the focussing components can be anodes with appropriate voltage, geometry and position. Such anodes are both, i.e. anode and focussing component.

The control circuit of the focussing electron beam device senses for deviations of the actual current value of the electron beam from the desired current value, adjusts the actual electron beam current value to the desired current value and adjusts the actual focus position to the desired focus position. The adjustment of the actual current value occurs by changing the first voltage V1. The adjustment of the actual focus position occurs by changing the second voltage V2.

Preferably adjustments of the first voltage V1 or of the second voltage V2 are initiated automatically when a deviation of the current values from a desired current value are sensed by the control circuit. Preferably the adjustments of the first voltage V1 or of the second voltage V2 occur continuously. "Continuously" means that the first or second voltages, V1 or V2, are adjusted in time intervals preferably smaller than one second and preferably less than one millisecond. In another preferred embodiment the first or second voltages, V1 or V2, are controlled through an analogue circuit using the electron beam current values as input This way a truly real time adjustment of the first or second voltage, V1 or V2, as a function of the sensed deviation of the actual current value from the desired current value can be established. The analogue circuit is part of the control circuit.

Preferably the control circuit increases the first voltage V1 when the actual electron beam current value is lower than the desired beam current value, and it decreases the first voltage V1 when the actual electron beam current value is sensed higher than the desired current value. The second voltage V2 serves to compensate focus shifts due to the changing first voltage V1.

In a preferred embodiment, the desired current value of the electron beam is a constant current value. In this embodiment, the control circuit preferably comprises a current source which delivers a constant current to the emitter. Preferably, the current source is implemented in the conducting line connecting the emitter with the extraction electrode. A current source is equivalent to a voltage source (e.g. the voltage source which generates the first voltage source V1) which controls the voltage in such a way that the actual current value is adjusted to a fixed current value (i.e. desired current value). To do so the current source comprises some means of sensing deviations of the actual current from the fixed current. Therefore a voltage source that adjusts an actual current value to a desired current value is equivalent to a current source.

The invention further provides a method for controlling an electron beam. In step a) an electron, beam is generated, preferably with a field emitter beam source with an emitter and an extraction electrode. The electron beam is generated by a first voltage V1 which is applied between the emitter and the extraction electrode.

In step b) the electrons of the electron beam are accelerated towards a specimen, preferably with an at least one anode. The acceleration of the electrons of the electron beam is, for example, induced by a second voltage V2 between emitter and the at least one anode.

In step c) the electron beam is focussed to a desired focus position. A desired focus position is preferably a spot on the surface or in the interior of the specimen. Preferably the focussing is being performed by focussing components like electromagnetic lenses, stigmators or even focussing anodes.

In step d) the electron beam current value is sensed for deviations of the actual current value from a desired current value. In one preferred embodiment the deviations of the actual current value from the desired current value are sensed by having the control circuit sense the net current flowing into the field emitter. This can be performed by reading the current values from a current sensing unit. Preferably the current sensing unit is implemented into a conducting lead connecting the emitter with one of the anodes. Preferably the actual electron beam current value is compared with the desired current value by the control circuit whose output is used to reduce the deviation of the electron beam current by changing the voltages of the first voltage V1. Preferably the sensing of the deviation of the electron beam current is performed in intervals smaller than one second and preferably less than one millisecond. In another preferred version the deviation of the electron beam current is sensed by an analogue circuit which senses deviations of the electron beam current at a rate which is only limited by the bandwidth of the analogue circuit. This way, deviations of the electron beam current value or the focal positions from the desired values can be corrected very fast. In another preferred embodiment, deviations of the actual electron beam current value from the desired current value are sensed when they are above a given threshold value.

In step e) a deviation of the actual electron beam currents value from a desired current value are adjusted to the desired current value by changing the first voltage V1. When the actual current value is higher than the desired beam current value the control circuit reduces the first voltage V1 and vice versa. Preferably, the adjustment is performed by reducing the deviation between the actual current value and the desired current value. Preferably, the reduction of the deviation is carried out by reducing the deviation below a given threshold value.

In step f) the focus position of the electron beam is adjusted to a desired focus position by controlling the second voltage V2. Since a change of electron beam current value, according to e), can lead to a change of the first voltage V1 the actual focus position can potentially be shifted away from the desired focus position. The shift of the focus position can be compensated by changing the second voltage V2. The second voltage V2 is preferably applied between the field emitter beam source and the at least one anode.

Preferably the second voltage V2 is adjusted according to a predetermined algorithm depending on the first voltage V1. A predetermined algorithm can be established by finding a first function f(ΔV1)=ΔZ, where ΔV1 is the change of the first voltage V1 to generate a change of focus position ΔZ, and a second function F(ΔZ)=ΔV2, where ΔV2 is the change of the second voltage V2 necessary to compensate the change of the focus position ΔZ. Both functions relate to each change of the first voltage V1 a change of the second voltage V2 necessary to compensate the focus position shift. Such a predetermined algorithm circumvents the problem of having to measure the actual focus position each time online during standard operation. Instead the predetermined algorithm is established preferably once and preferably before the focussing electron beam device is put into standard operation. The kind of predetermined algorithm depends on the details of the design of the electron beam column. Optionally, the predetermined algorithm is established from experiment or from theoretical design considerations. Preferably the predetermined algorithm is incorporated into the focussing electron beam device for repeatable operational use. In one preferred embodiment the predetermined algorithm is implemented as software code or as data of a data base which are in functional connection with the control circuit. In another embodiment the predetermined algorithm is implemented as an electronic circuit being part of the control circuit.

Preferably the control circuit adjusts the first voltage V1 and/or preferably also the second voltage V2 in time intervals smaller than one second and preferably smaller than one millisecond. The faster the adjustments the smaller is the fluctuation of the electron beam current values and the changes of the focus position due to the current adjustment.

Preferably the second electronic voltage V2 is applied between emitter and the at least one anode. A change of the voltage V2 between emitter and the at least one anode changes the energy of the electrons of the electron beam which changes the focal length of the electromagnetic focussing components which in turn changes the focus position. Therefore, in a preferred embodiment a change of the second voltage V2 can be used to adjust the actual focal position when a change of the first voltage V1 has generated a focus position shift. In another preferred embodiment, the changes of the second voltage V2 distort the electric field lines in such a way that they influence the focus of the electron beam. An appropriate change of the second voltage V2 therefore can adjust the actual focus position to the desired focus position.

In a preferred embodiment the second voltage V2 is a set of second voltages. Some of the second voltages may be applied to at least one anode with respect to the emitter. Preferably, other second voltages of the set of second voltages may be applied to other components adjusting the focus position, like e.g. electromagnetic lenses or scanning coils. The second voltage V2 therefore is preferably to be understood as the set of second voltages to provide the voltages for the various components that help to adjust the actual focus position of the electron beam to the desired focus position.

In another preferred embodiment the set of second voltages V2 is applied to focussing components of the focussed electron beam device. Since the set of second voltages V2 is meant for adjustment of the focus position of the electron beam it can be advantageous to also adjust the voltages (or currents) of the electromagnetic lenses, scan coils, the stigmators and other components necessary to focus the beam to the desired beam position.

However, for simplicity of the set up it is most preferred to control only one second voltage V2 in order to adjust an actual focus position of the electron beam to a desired focus position.

In a preferred embodiment of the invention one anode is positioned between the field emitter beam source and focussing components. This way the electron beam can be accelerated to a high energy early on by the second voltage V2 between the emitter and this anode. An early acceleration to a high energy reduces the effects of diffusion or disturbing fields which laterally spread the electron beam on its path to the specimen. An early acceleration to full energy also reduces the spreading of the electron beam due to inhomogeneous electric or magnetic fields on its path to the specimen.

In another preferred embodiment one of the at least one anodes is capable of serving as a support structure for the specimen on which the electron beam is focussed. This way the specimen can be brought in a conducting contact with the anode which helps to reduce charge up of the specimen.

Preferably the electron beam source is replaced by an array of field emitter beam sources capable of generating an array of electron beams. Optionally, the electron beams of the array of electron beams are directed onto the specimen. This way a specimen or a surface to be structured can be probed or structured in parallel, thereby increasing the throughput significantly. Preferably the field emitter beam sources of the array of field emitter beam sources are positioned in a plane vertically to the electron beams. In one preferred embodiment of the invention the focussing electron beam device comprises an array of microcolumns where the field emitter beam sources of the microcolumns make up the array of field emitter beam sources. Such an embodiment of the invention allows for a highly parallel design of the focussing electron beam device to scan the specimens with high through-put. Preferably, the microcolumns have individual focussing components to adjust the focus positions individually.

In another preferred embodiment the focussing electron beam device comprises focussing components common to more than one electron beam of the array of field emitter beam source. This can simplify the design and operation of the focussing electron beam device considerably. Also, the use of the same focussing components allows for very dense packaging of the array of field emitter beam sources since no structures to hold individual focussing components are needed between the electron beams.

Preferably each field emitter beam source of the array of field emitter beam sources comprises a separate control circuit to control the first voltages V1 individually. This way the current values of each electron beam of the array of field emitter beam sources can be adjusted to desired current values individually. Disturbing artifacts of images or structures on the surface of a specimen due to fluctuations of field emitter beam sources can be reduced this way. Also, the life time of an array of field emitter beam sources can be increased since a defective field emitter in the array, which has a short-circuit between emitter and extraction electrode, can be switched off. Otherwise, with a global biasing of all field emitter beam sources with a single first voltage V1, a single field emitter beam source failure could make the array nonfunctional.

In a preferred embodiment of the invention the current values are adjusted to a single current value. This way the specimen is exposed to the same electron beam current, independent of which electron beam of the array of electron beams is scanning the specimen. A homogenous exposure to the electron beams helps to generate structures with high homogeneity, also images of specimens which have been probed with the same electron beam current are more homogeneous and display better spatial resolution.

Preferably each field emitter beam source of the array of field emitter beam sources comprises a separate control circuit to control the second voltage V2 individually. This way the actual focal positions of the electron beams can be adjusted to the desired focal positions individually. The individual adjustment of the focus positions yields the best spatial resolution for imaging as well as for structuring the surface of the specimen.

Preferably each field emitter beam source of the array of field emitter beam sources comprises its own current sensing unit to deliver current values to the corresponding control circuit. This way the currents of the electron beams can be measured individually to make possible individual adjustments of electron beam current values to the desired beam current values.

Preferably the array of field emitter beam sources is integrated onto a substrate. Such an array allows for a compact and rigid setup for the electron beam device. The integration of the field emitter beam sources onto the substrate can be done by using well-known micromechanical or microelectronic thin film and structuring techniques. Such techniques allow for a cost-effective design with very high precision. High precision during manufacturing of the arrays is needed for shaping the emitter tips and for the spacing between emitter and extracting electrodes in order to achieve a high uniformity of the electron beam current behavior of the array. Preferably the extraction electrodes are segmented for each emitter in order to be able to bias each field emitter beam source individually.

The use of thin film and structuring techniques for manufacturing arrays of field emitter beam sources allows for a design of arrays of field emitter beam sources with high package density. Preferably a pitch between adjoining field emitter beam sources of less than 100 $\mu$m, preferably less than 10 $\mu$m or even less than 1 $\mu$m is used, while the number of field emitter beam sources in the array is preferably higher than a thousand or even higher than a million. Preferably the substrate is a monolithic substrate, preferably made out of silicon or another semiconductor material. With silicon as substrate an integration of electronic circuits to control the voltages for the field emitter beam source control can be done. Also, extracting electrodes can be easily integrated onto a silicon substrate using microprocessing techniques.

Preferably active electronic components, e.g. transistors or diodes, of the control circuit are integrated onto the substrate. Using thin film techniques it is possible to integrate active electronic components of the control circuit onto the substrate in order to minimize the space and to be able to bias the possibly thousands of field emitter beam sources. Furthermore, the integration of the electronic components close to the field emitter beam sources minimizes electromagnetic interference and malfunction due to cable defects and the like. In particular, the high integration density allows for a complex control circuitry at little space which is necessary to adjust the first or second voltages, V1 or V2, for each field emitter beam source individually.

It is noted that the invention also applies to focussing beam devices with charged particle beams other than those made of electrons. For example there are field ion emitters which emit ions when applying a strong electric field to the tip of the emitter. Since emitted ions beams can be accelerated and focussed like electron beams they can also be adjusted with respect to current value and focus position according to the invention.

It is further noted that focussing electron beam devices with arrays of field emitter beam sources also comprise the advantages which, for simplicity of the description only, have been described only for focussing electron beam devices with a single field emitter beam source. In particular, the advantages connected with the dependent claims 2 to 18 also apply to a focussing electron beam device with an array of field emitter beam sources. The same holds true for the method for controlling an electron beam where the advantages connected with the dependent claims 21 to 37 also apply to the methods for controlling an array of electron beams.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1:
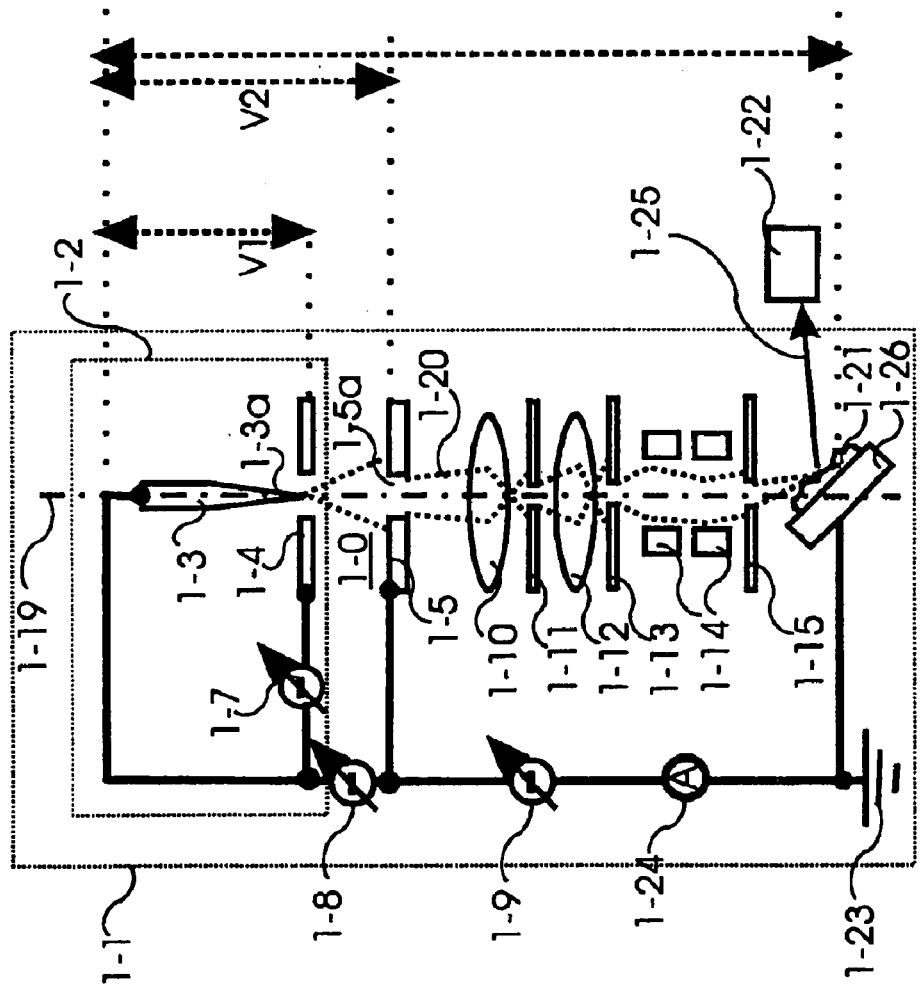
FIG. 1 shows a schematic drawing of a prior art scanning electron microscope (SEM) as an example of an electron beam device.

A focussing electron beam device of the prior art is shown schematically in FIG. 1 and has been described in detail in the chapter describing the background of the invention.

Figure 2A:
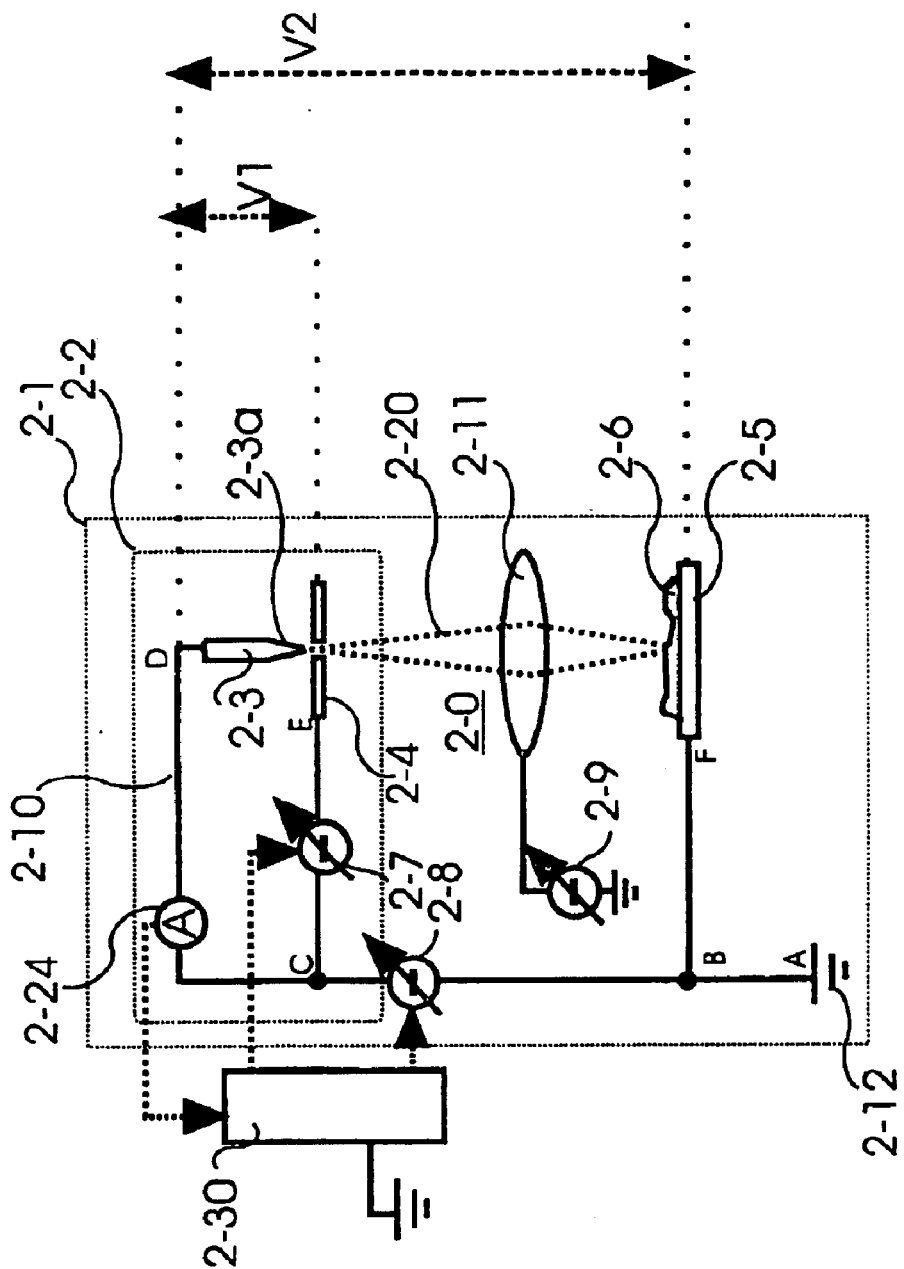
FIG. 2a shows a first embodiment according to the invention with one field emitter beam source and a control circuit controlling a first voltage V1 and a second voltage V2.

FIG. 2a describes schematically an electron beam column 2-1 of a first embodiment according to the invention. The focussing electron beam device 2-1 comprises a field emitter beam source 2—2, focussing components 2-11, a specimen 2-6 on an anode 2-5. The field emitter beam source 2—2 comprises an emitter 2-3 with an emitter tip 2-3a, an extraction electrode 24 and a 1$^{st}$ voltage source 2-7 applying its voltage between the emitter 2-3 and the extraction electrode 24 on a cable tree 2-10. The word "cable tree" has to be understood in a broad sense, i.e. it can comprise cables, conducting leads on a printed circuit board, conducting leads on a semiconductor substrate or other leads to make electrical connections. In this embodiment of the invention, the 1$^{st}$ voltage source is applied between the nodes E and C of the cable tree 2-10, i.e. between the extraction electrode 2-4 and the cable connecting the anode 2-5 with the emitter 2-3. Also shown in FIG. 2a is a reference ground 2-12 which in this embodiment has the same electrical potential as the anode 2-5. However, this is only an example, since the reference ground may also be at the emitter 2-3 or somewhere else.

The first voltage V1, which is the voltage between the emitter 2-3 and the extraction electrode 24, is determined in this embodiment by the 1$^{st}$ voltage source 2-7. The polarity of the first voltage V1 is preferably such that the voltage at the extraction electrode 2-4 is positive with respect to the voltage of the emitter 2-3 in order to be able to extract electrons from the emitter 2-3 into the vacuum 2-0. In order to protect the emitter 2-3 from pollution with even very thin layers of molecules, the vacuum is preferably of high quality in the neighborhood of the emitter (preferably better than 10$^{-6}$ mb). The value of the first voltage V1 depends on parameters such as the electron beam current value needed, the material of the emitter 2-3, the shape of the emitter tip 2-3a, the distance between extraction electrode 24 and emitter tip 2-3a, the temperature of the emitter and the like. The best electron beam current values depend on the application and on the specimen that are to be examined or structured, and are known in the art. Manufacturing and operation of field emitter beam sources of various types is also known in the art and, therefore, is not described in more detail.

The second voltage V2, which is the voltage between the emitter 2-3 and the anode 2-5, is determined in this embodiment by the 2$^{nd}$ voltage source 2-8. In this embodiment of the invention the 2$^{nd}$ voltage source 2-8 is positioned between the nodes B and C of the cable tree 2-10, i.e. between the anode 2-5 and the cable connecting the extraction electrode 2-4 with the emitter 2-3. The polarity of the second voltage V2 is preferably such that the voltage at the anode 2-5 is positive with respect to the voltage at the emitter 2-3 in order to be able to accelerate the electrons of the electron beam 2-20 from the field emitter beam source 2—2 towards the specimen 2-6.

The focussing component 2-11 is e.g. an electromagnetic lens whose magnetic field focusses the electron beam 2-20 onto the specimen 2-6. Preferably, the magnetic field of the focussing component 2-11 is controlled by a current flowing through a coil. The current in turn, in this embodiment, is determined by a 3$^{rd}$ voltage source 2-9. The use of magnetic lenses for electron beam columns is known in the art and is not further described. This invention, however, is not limited to magnetic lenses as focussing components but applies to any component which can be used for focussing electron beams.

The control circuit 2-30 in this preferred embodiment of the invention controls the voltages of the 1$^{st}$ voltage source 2-7 and of the 2$^{nd}$ voltage source 2-8. At the same time the control circuit 2-30 uses the current values of the current sensing unit 2-24 as input. The current sensing unit 2-24 in this preferred embodiment is positioned between node D and node C, i.e. between the emitter 2-3 and the cable connecting the anode 2-5 with the extraction electrode 2-4. In this position, the current sensing unit 2-24 measures the electron beam current emitted from the emitter 2-3. This current value may not be equal to the electron beam current value arriving at the specimen 2-6 since extraction electrode 24, apertures and other components along the path of the electron beam 2-20 may absorb significant parts of the electron beam 2-20. Therefore other positions for a measurement of the electron beam currents, e.g. between node B and C which is between anode 2-5 and the cable connecting extraction electrode 2-4 with the emitter 2-3, may be superior in terms of measurement precision. However measuring the electron beam current at the emitter is easier to do and may be sufficient for sensing deviations of the electron beam current from a desired current value, i.e. to do a relative measurement of the electron beam current.

The control circuit uses the input from the current sensing unit 2-24 for sensing deviations of the actual current value from the desired current value of the electron beam. Preferably the desired current value is a constant value. Therefore, a change of the current measured with the current measured device 2-24 indicates a deviation from a desired current value and initiates a change of the voltage of the 1$^{st}$ voltage source 2-7 to change the voltage between emitter 2-3 and extraction electrode 2-4 in order to adjust the actual current value of the electron beam to the desired current value. This way the current value of the electron beam 2-20 can be adjusted to a desired value and fluctuations of the current value of the electron beam can be reduced below a given threshold.

However, a change of the voltage of the 1$^{st}$ voltage source, which in FIG. 2a is the first voltage V1, may shift the focus position of the electron beam 2-20 off the desired focus position. To adjust the shifted focus position back to the desired focus position, the second voltage V2 is changed by the control circuit 2-30 which changes the voltage of the 2$^{nd}$ voltage source 2-8 between anode 2-5 and emitter 2-3. Preferably the change of the voltage of the 2$^{nd}$ voltage source 2-8 is initiated by a predetermined algorithm implemented in the control circuit 2-30 which relates changes of the first voltage V1 to changes of the second voltage V2. The predetermined algorithm can be determined, e.g., through theoretical or experimental studies of the electron beam column 2-1. Preferably, the predetermined algorithm is implemented in the control circuit 2-30 in the form of an analog circuit, as a digital electronic circuit, as values of a database or a combination of these.

The specimen 2-6 in FIG. 2a is drawn as an example of something which is to be probed by the focussed electron beam 2-20. The specimen 2-6 may be a wafer or a mask whose surface is to be structured. It may also be something whose surface or interior is to be inspected with a radiation detector not shown in FIG. 2a. In any case, the specimen 2-6 is not part of the electron beam column 2-1 and is only drawn for better understanding.

It has already been mentioned that the functionality of the current sensing unit 2-24 in combination with the control of the 1$^{st}$ voltage source 2-7 is equivalent to the functionality of a current source: a current source also senses the actual current and changes its output voltage in order to adjust its output current to a desired current value. Therefore, current sensing unit 2-24, 1$^{st}$ voltage source 2-7 and the control circuit controlling 1$^{st}$ voltage source 2-7 may as well be replaced by a current source.

Figure 2B:
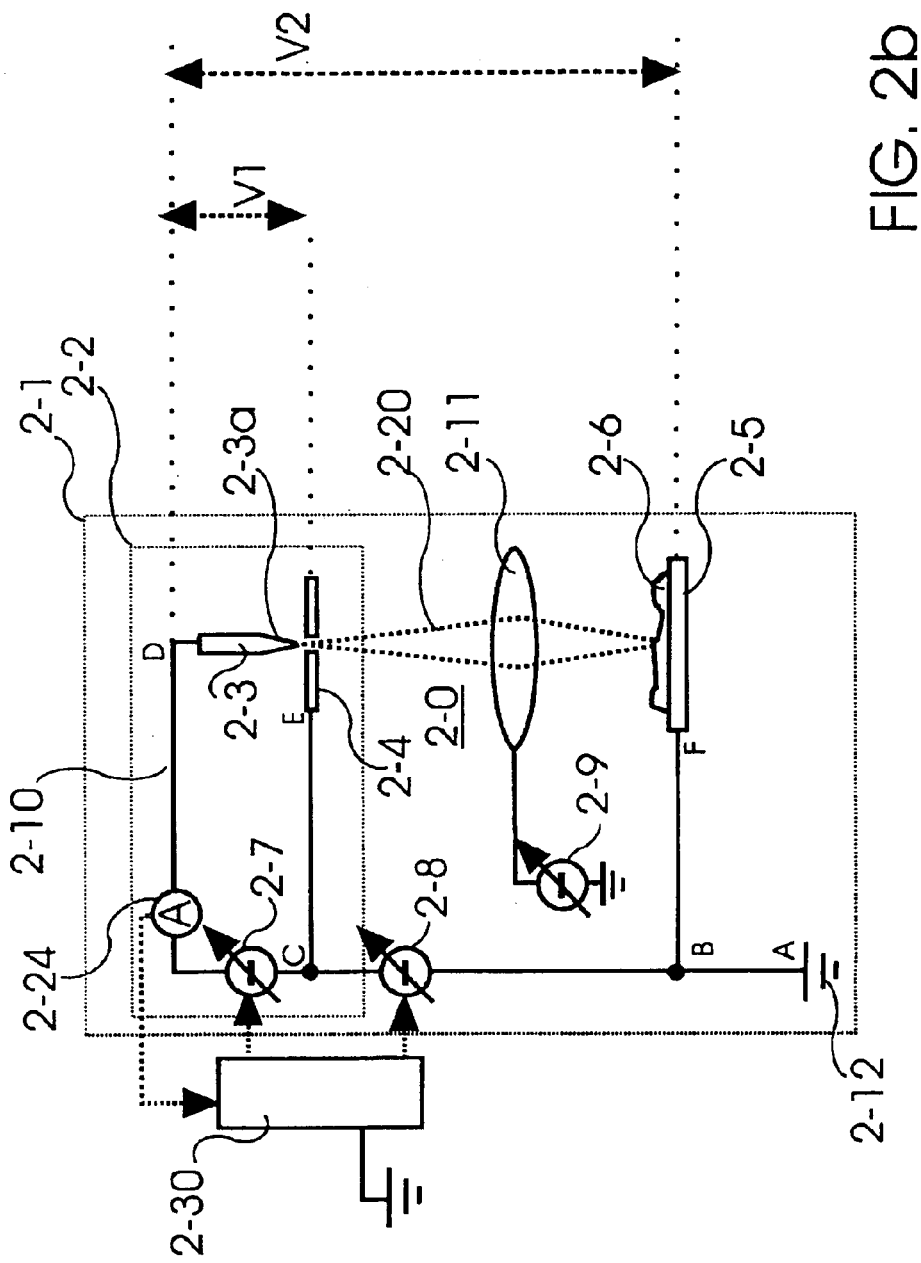
FIG. 2b shows a second embodiment according to the invention with one field emitter beam source and a control circuit controlling a first voltage V1 and a second voltage V2.

FIG. 2b is similar to FIG. 2a. The main difference is that in FIG. 2b the 1$^{st}$ voltage source 2-7 is placed in the cable tree 2-10 between node D and node C, i.e. between emitter 2-3 and cable connecting anode 2-5 with extraction electrode 24. The $2^{nd}$ voltage source 2-8 is like in FIG. 2a between node B and node C. Therefore the second voltage V2 between emitter 2-3 and anode 2-5 is equal to the sum of the voltages of the $1^{st}$ voltage source 2-7 and the $2^{nd}$ voltage source 2-8. Changing the second voltage V2 to adjust the actual focus position of the electron beam 2-20 to the desired focus position therefore needs a different control circuit 2-30 compared to the control circuit of FIG. 2a Preferably the predetermined algorithm relating changes of the first voltage V1 to the second voltage V2 may however remain the same.

Figure 2C:
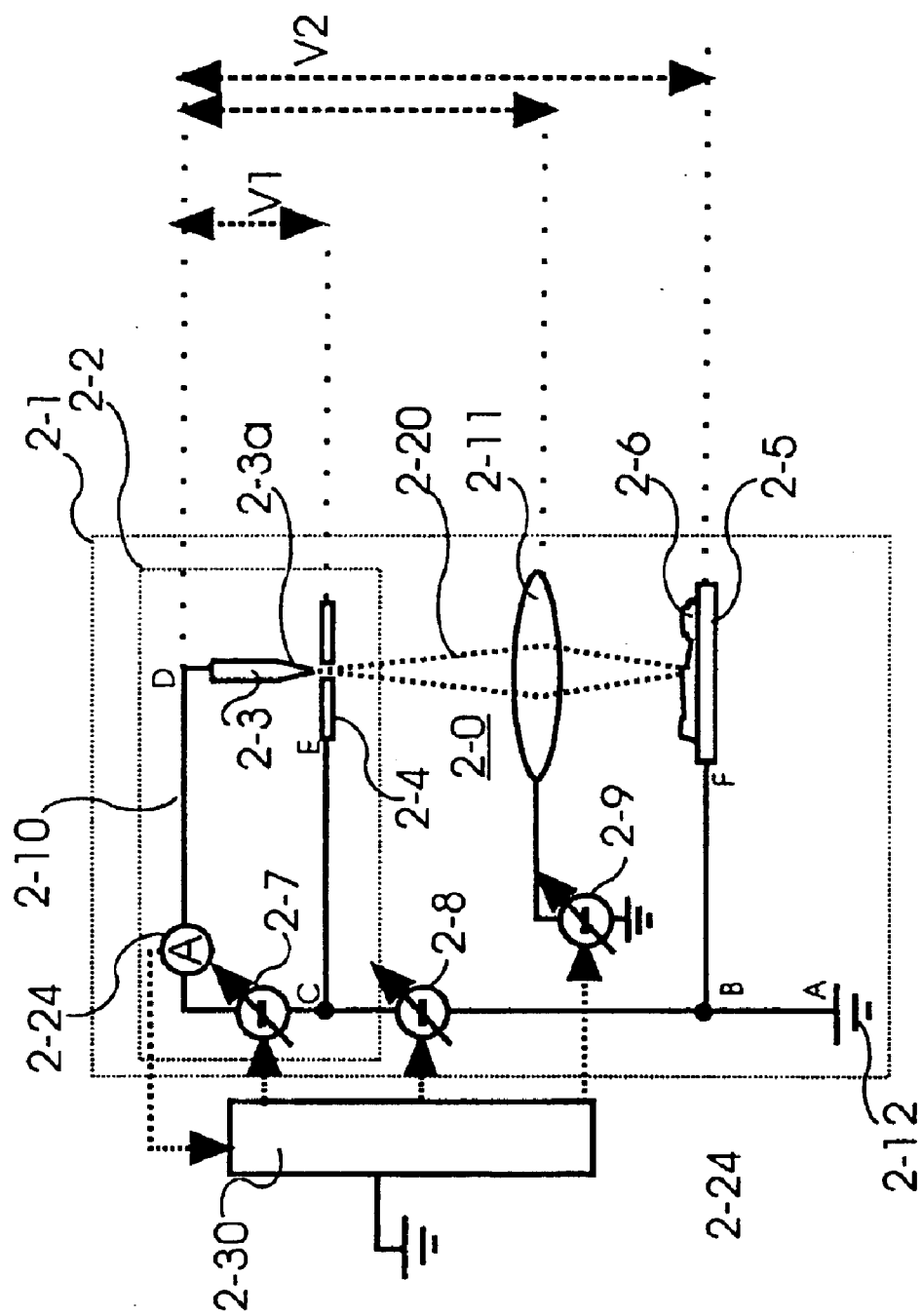
FIG. 2c shows a third embodiment according to the invention with one field emitter beam source and a control circuit controlling a first voltage V1 and two voltages belonging to a set of second voltages V2.
Figure 2D:
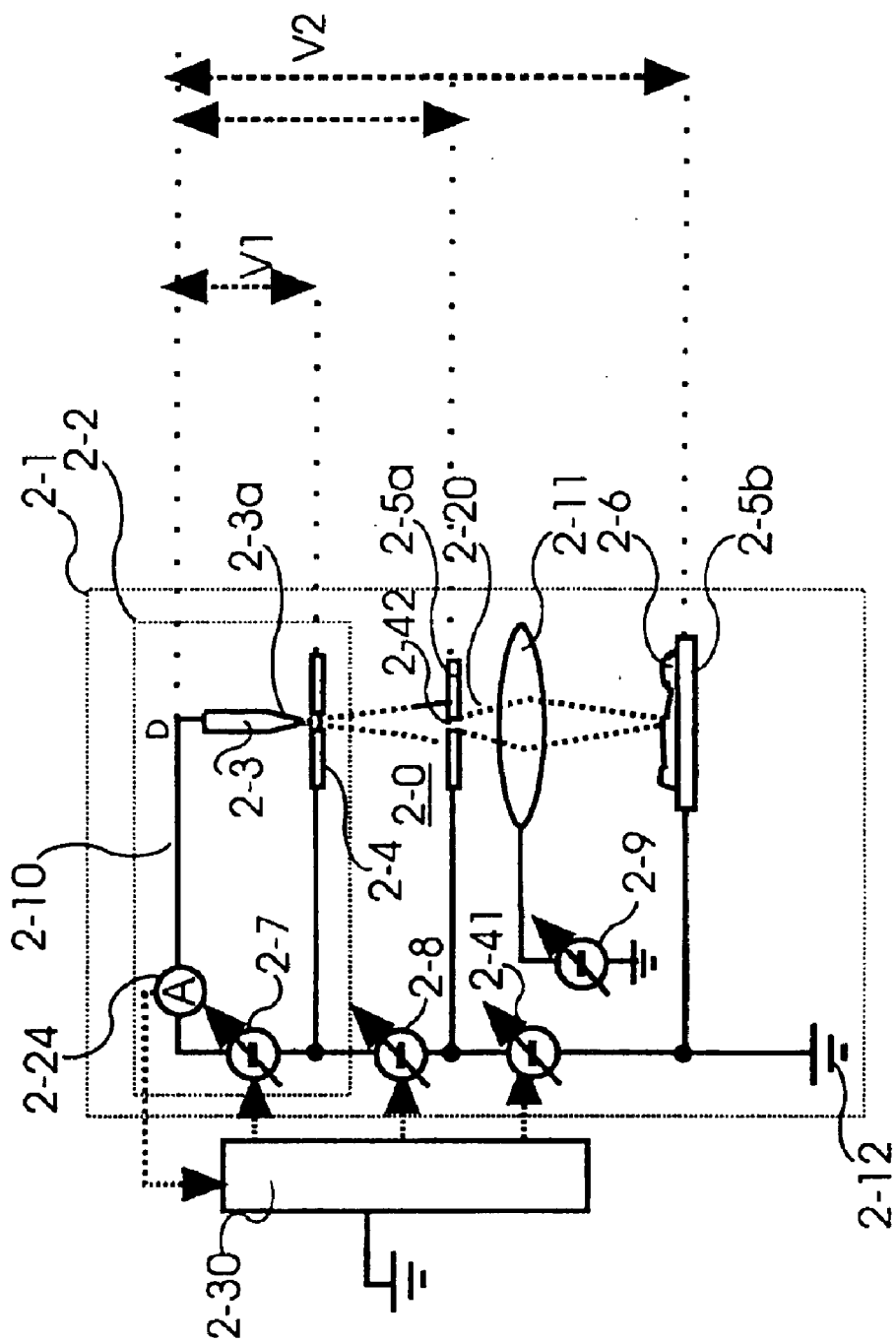
FIG. 2d shows a fourth embodiment according to the invention with one field emitter beam source and a control circuit controlling a first voltage V1 and two voltages belonging to a set of second voltages V2.
Figure 2E:
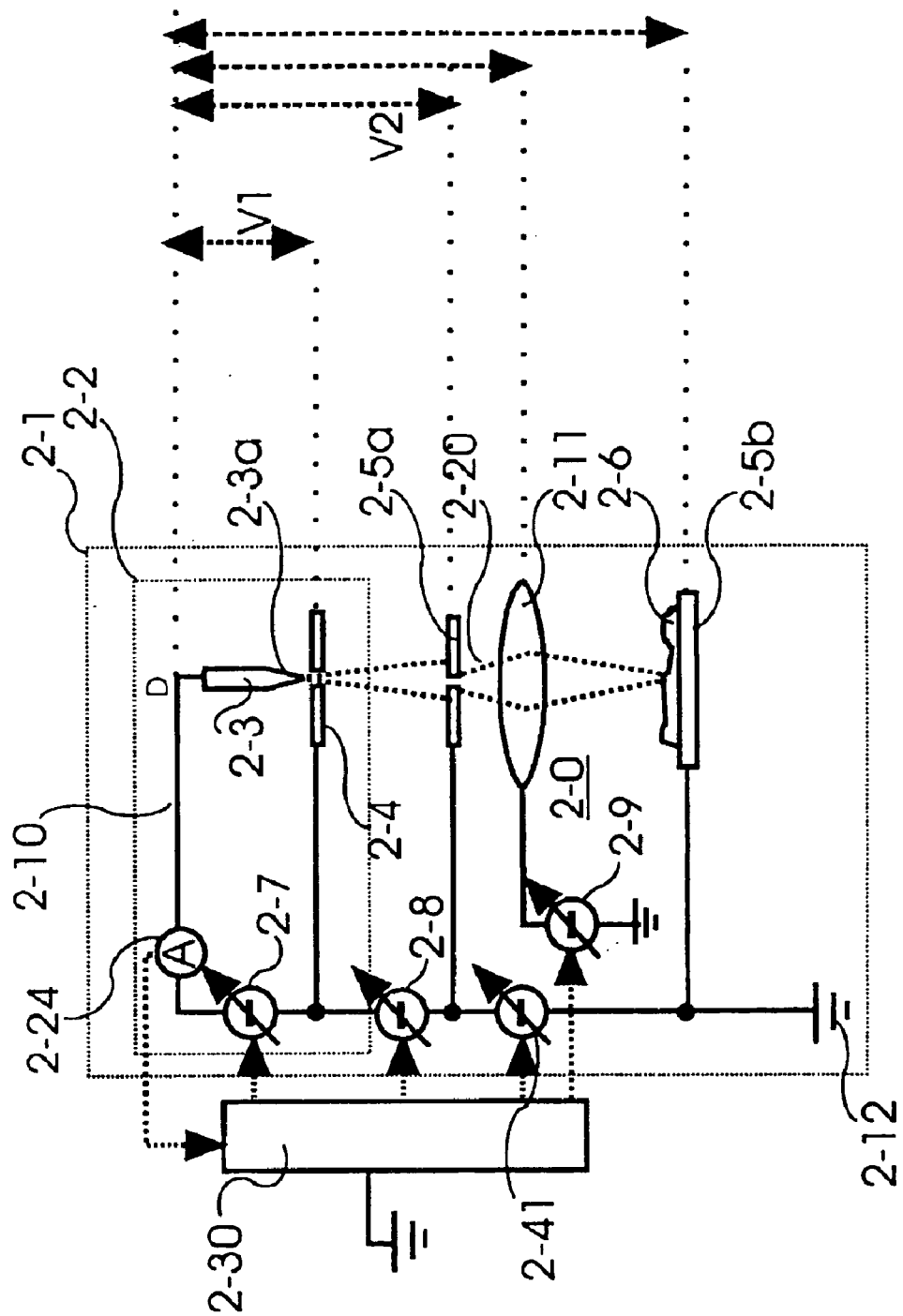
FIG. 2e shows a fifth embodiment according to the invention with one field emitter beam source and a control circuit controlling a first voltage V1 and three voltages belonging to a set of second voltages V2.

FIGS. 2c to 2e are different from FIG. 2b in that the control circuit 2-30 controls more than one voltage, i.e. a set of second voltage V2, to adjust the focus position of the electron beam 2-20 to the desired focus position. The complexity of an electron beam column and a high focus precision requirement may make it necessary that the focus position be adjusted by more than one second voltage V2. FIG. 2c) to 2e) show three examples where a set of second voltages V2 controls more than one component in the electron beam column to adjust the actual focus position to the desired focus position. The three figures, 2c to 2e, are only examples of sets of components being controlled by a set of second voltages V2, which are to be understood as not limiting illustrations. It is self-understood that there exist other component sets whose voltage or current can be controlled by a set of second voltages V2 to adjust an actual focus position to the desired focus position.

In FIG. 2c, the set of second voltages V2 comprises a) a voltage between emitter 2-3 and anode 2-5, which is the sum of the voltages of $1^{st}$ voltage source 2-7 and $2^{nd}$ voltage source 2-8, and b) a voltage generated by a $3^{rd}$ voltage source 2-9 to deliver the current for the focal component, preferably an electromagnetic lens 2-11. The $3^{rd}$ voltage source can also be a current source. The advantage of this embodiment of the invention is that the additional control of the focus components by the control circuit 2-30 enables more sensitive focus position adjustments over a larger range. This measure further improves the stabilization of the electron beam. Of course the focussing components may also comprise several focussing elements with more than one voltage sources to operate. FIG. 2c is to be understood as an example for an electron beam column where the adjustment of the focus positions is being performed by a control circuit 2-30 controlling focussing components.

FIG. 2d is different from FIG. 2b in that FIG. 2d comprises two anodes to be controlled, i.e. a first anode 2-5a and a second anode 2-5b. The first anode is positioned between the field emitter beam source 2—2 and the focussing components 2-11. The second anode 2-5b is at a position where it also serves as a supporting structure of the specimen 2-6. The first anode 2-5a accelerates the electron beam 2-20 early on to high energy to reduce the spread of the electron beam 2-20 due to diffusion, small distorting electric fields etc. The anode 2-5a with the anode opening 242 offers in addition a means for focus adjustment, independent from focus adjustment by the second anode 2-5b. Therefore the control circuit can adjust the focus position by controlling the voltages of the set of two independent second voltages V2. This is being done by changing the voltages of the $1^{st}$ voltage source 2-7, $2^{nd}$ voltage source 2-8 and $4^{th}$ voltage source 2-41.

FIG. 2e shows an electron beam column 2-1 like in FIG. 2d except that the control circuit 2-30 controls a set of second voltages V2 with three voltages. One of the three voltages is applied between emitter 2-3 and the first anode 2-5a to accelerate and focus the electron beam, the second of the three voltages is applied to the focussing components 2-11 to focus the electron beam and the third of the three voltages is applied between emitter 2-3 and the second anode 2-5b to accelerate the electron beam while it passes through the focussing components 2-11. With the three voltages representing the set of the second voltages V2 it is possible to adjust the focus position of the electron beam to the desired focus position with high sensitivity over a large range.

Figure 3A:
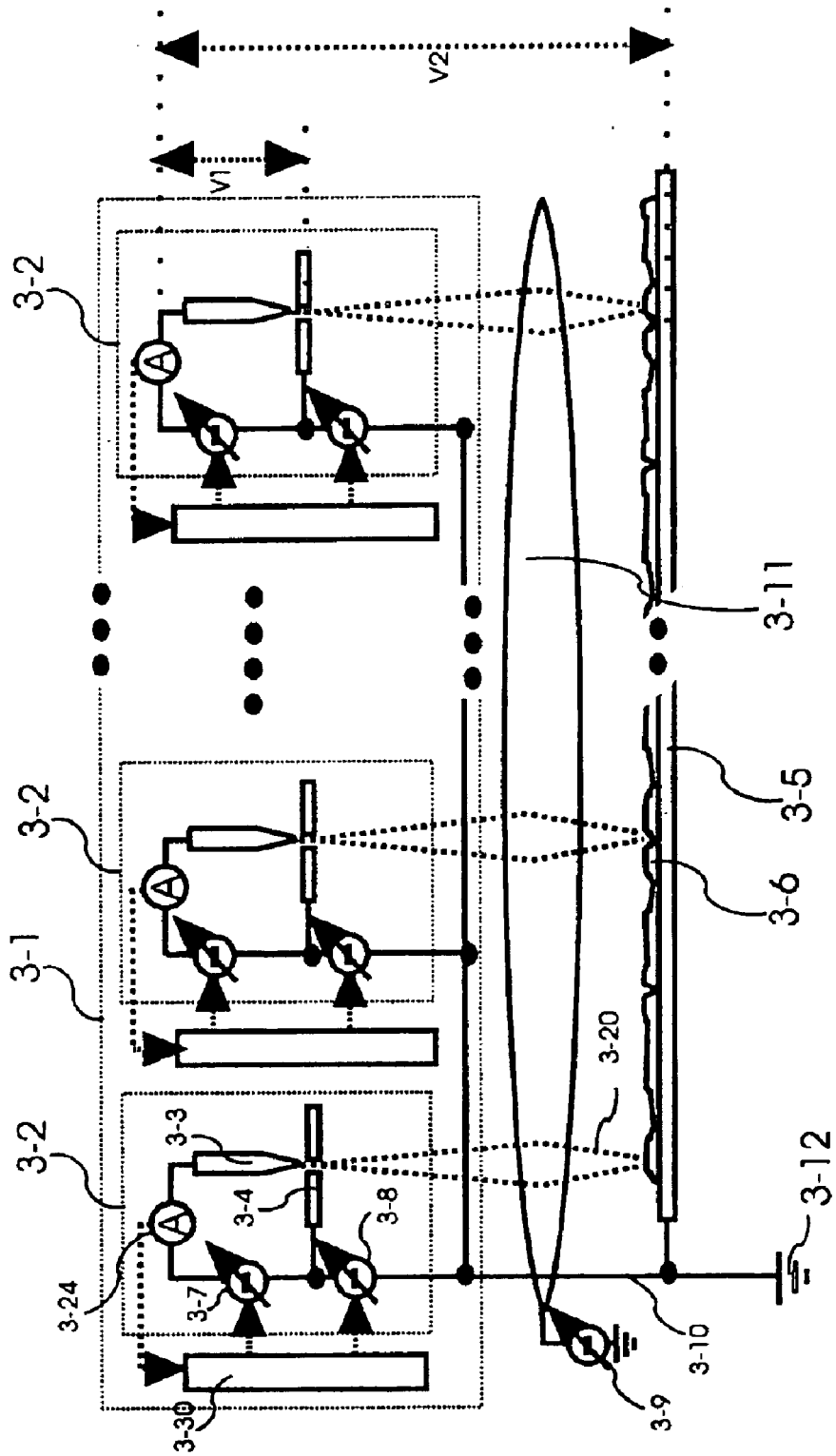
FIG. 3a shows a sixth embodiment according to the invention with an array of field emitter beam sources with a common anode.

FIG. 3a shows a focussing electron beam device with an array 3-1 of field emitter beam sources 3-2. In contrast, focussing components 3-11, specimen 3-6 and anode 3-5, which preferably also serves as support for the specimen 3-6, remain common for the array of electron beams 3-20. The field emitter beam sources 3-2 of the array of field emitter beam sources 3-0 preferably are operated in parallel, thereby increasing the throughput for inspecting or structuring a specimen significantly.

In this preferred embodiment of the invention the focussing components 3-11 are the same for the electron beams 3-20. Focussing components which have been used for more than one electron beam in parallel have been disclosed, e.g., in the US patent U.S. Pat. No. 5,969,362. The focussing component 3-11 in this embodiment is an electromagnetic lens having a magnetic field which is homogeneous in the plane vertically to the electron beams and whose field line direction is parallel to the electron beams. The use of the same focussing electromagnetic lenses common to all electron beams makes it possible to place the field emitter beam sources 3-2 very close to each other, since no place consuming structure is needed between electron beams to support individual focussing components. As a non-limiting example the focussing component 3-11 is supplied for operation by a single $3^{rd}$ voltage source 3-9.

In a preferred embodiment of the invention each field emitter beam source 3-2 comprises an emitter 3—3, an extraction electrode 3-4, a $1^{st}$ voltage source 3-7 which determines the first voltage V1 between emitter and extraction electrode 3-4, a $2^{nd}$ voltage source 3-8 which added to the $1^{st}$ voltage source 3-7 determines the second voltage V2 between emitter 3—3 and anode 3-5. Like in FIG. 2b, a current sensing unit 3-24 to measure the current flowing to emitter 3—3 is placed into the cable tree 3-10 between emitter 3—3 and the lead connecting the extraction electrodes 34 with the anode 3-5. As in FIG. 2b, the first voltages V1 and the second voltages V2 for each field emitter beam source 3-2 are controlled by the control circuits 3-30 whereby the current measured with the current sensing unit 3-24 is used as input for adjusting the electron beam current values. Preferably every field emitter beam source 3-2 is connected to a separate control circuit 3-30 which allows that the first voltages V1 between emitters 3—3 and corresponding extracting electrode 34 and the second voltages V2 between emitters 3—3 and anode 3-5 are controlled individually.

The individual control of the first voltages V1 of the array of field emitter beam sources allows the stabilization of the current value of each electron beam individually to desired current values, thus increasing the spatial resolution of the images of a specimen or of the surface structures on the specimen. The individual control of the first voltages V1 of the array of field emitter beam sources also enables the focussing electron beam device to operate the beams with the same desired current value. This makes the operation of the electron beam device, the reconstruction of images and the generation of structures on the surface of the specimen easier and more uniform. Finally the individual control of the first voltage V1 enables the array to vary desired current values individually or to switch them off, e.g. in the case of an emitter short-circuit with the extracting electrode.

The field emitter beam source array 3-2 is preferably integrated onto a substrate, preferably on a semiconductor wafer. Because of known technology of manufacturing micromechanical and microelectronical structures with high integration, it is possible to fabricate arrays of emitters 3—3 and extraction electrodes 3-4 with a pitch of less than a few micrometers and even of less than one micrometer. Thereby, it depends on the application which spacing between neighbored field emitter beam sources is optimal. Up to a thousand or even more than a million field emitter beam sources can be fabricated onto a chip of a wafer. Examples of arrays of field emitter beam sources integrated onto a semiconductor wafer are known and disclosed e.g. in U.S. Pat. No. 5,986,388 or U.S. Pat. No. 5,969,362.

All or at least parts of the electronics of the control circuits 3-30 are preferably integrated onto the substrate. Preferably, the control circuits 3-30 of each field emitter beam source 3-2 are integrated onto the semiconductor wafer before emitters 3—3 and extraction electrodes 3-4 are fabricated onto the wafer. The integration of the control circuits onto the substrate avoids having to connect an array of more than a thousand or even more than a million field emitter beam sources with cables to their external $1^{st}$ or $2^{nd}$ voltage sources. Preferably, the first, voltages V1 and the current sensing units 3-24 are replaced by current sources. A current source may simply be a transistor where the emitter is connected to the drain (or collector). Such an arrangement is economical spacewise, which is important for large, densely packed arrays of field emitter beam sources.

Figure 3B:
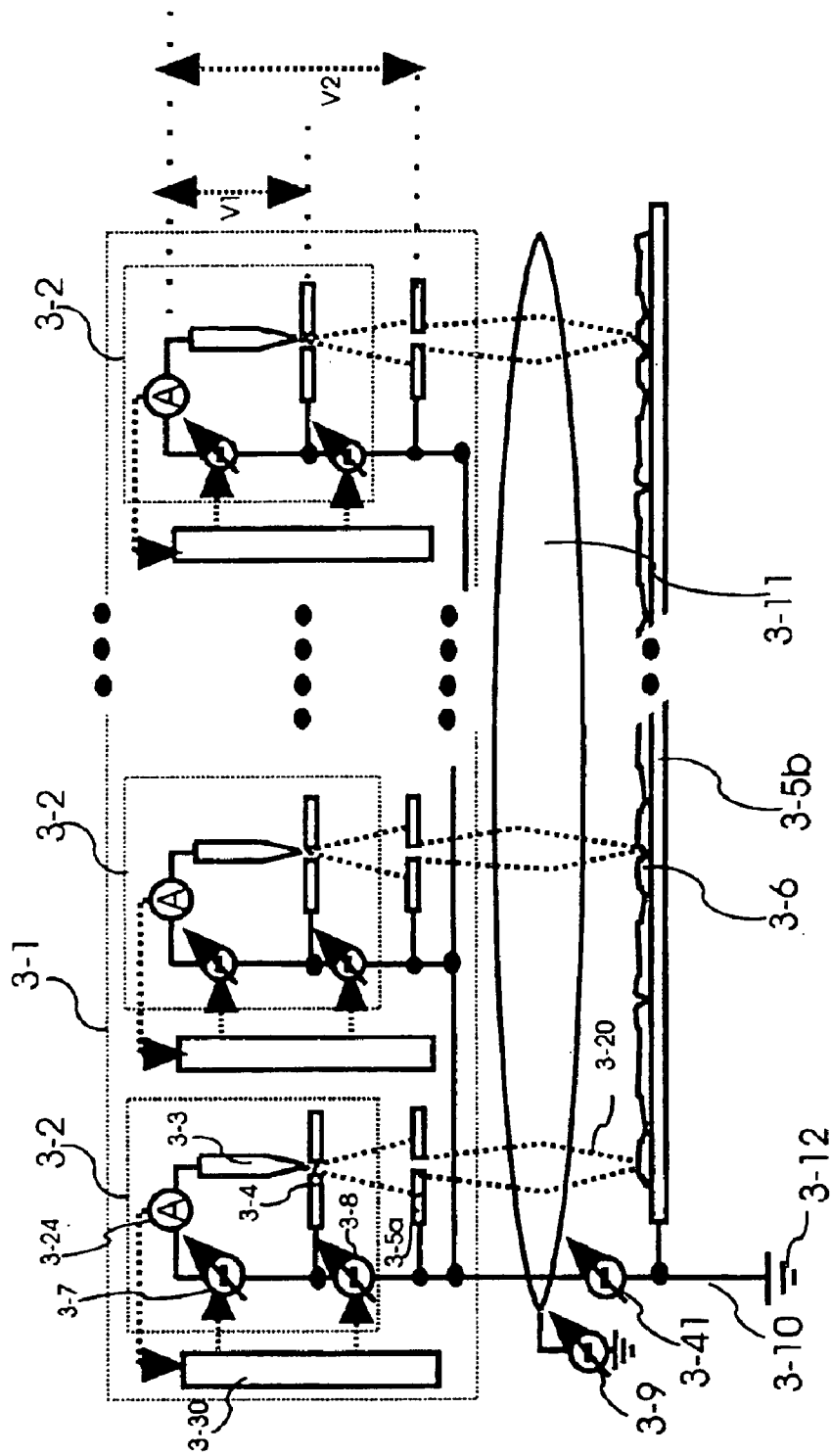
FIG. 3b shows a seventh embodiment according to the invention with an array of field emitter beam sources and an array of anodes.

FIG. 3b shows a focussing electron beam device similar to FIG. 3a with the difference that each field emitter beam source 3-2 comprises two anodes. The first anode 3-5a is assigned individually to each field emitter beam source 3-2 and the second anode 3-5b is assigned to more than one emitter beam source 3-2. As shown in FIG. 2d, the first anode 3-5a serves to accelerate the electron beam 3-20 to a higher energy before the electron beam 3-20 reaches the focal components 3-11. It can also be used to focus the electron beam 3-20. The second anode 3-5b serves to accelerate the electron beam 3-20 towards the specimen 3-6.

As shown in FIG. 3a the second voltage V2 of each field emitter beam source is individually adjustable. The second voltage V2 of each electron beam 3-20 is made up of the sum of the voltages of the $1^{st}$ voltage source 3-7 and the $2^{nd}$ voltage source 3-8. The additional first anode 3-5a is used to accelerate and focus each electron beam 3-20 individually with more degrees of freedom compared to the design in FIG. 3a. The first anodes 3-5a also may have a collimating function for the electron beams by shutting off outer parts of the electron beam to improve the focussing properties. In one preferred embodiment of the invention the focussing properties of the first anodes are sufficient for focussing the electron beam, thus making the focussing components 3-11 obsolete.

Figure 4A:
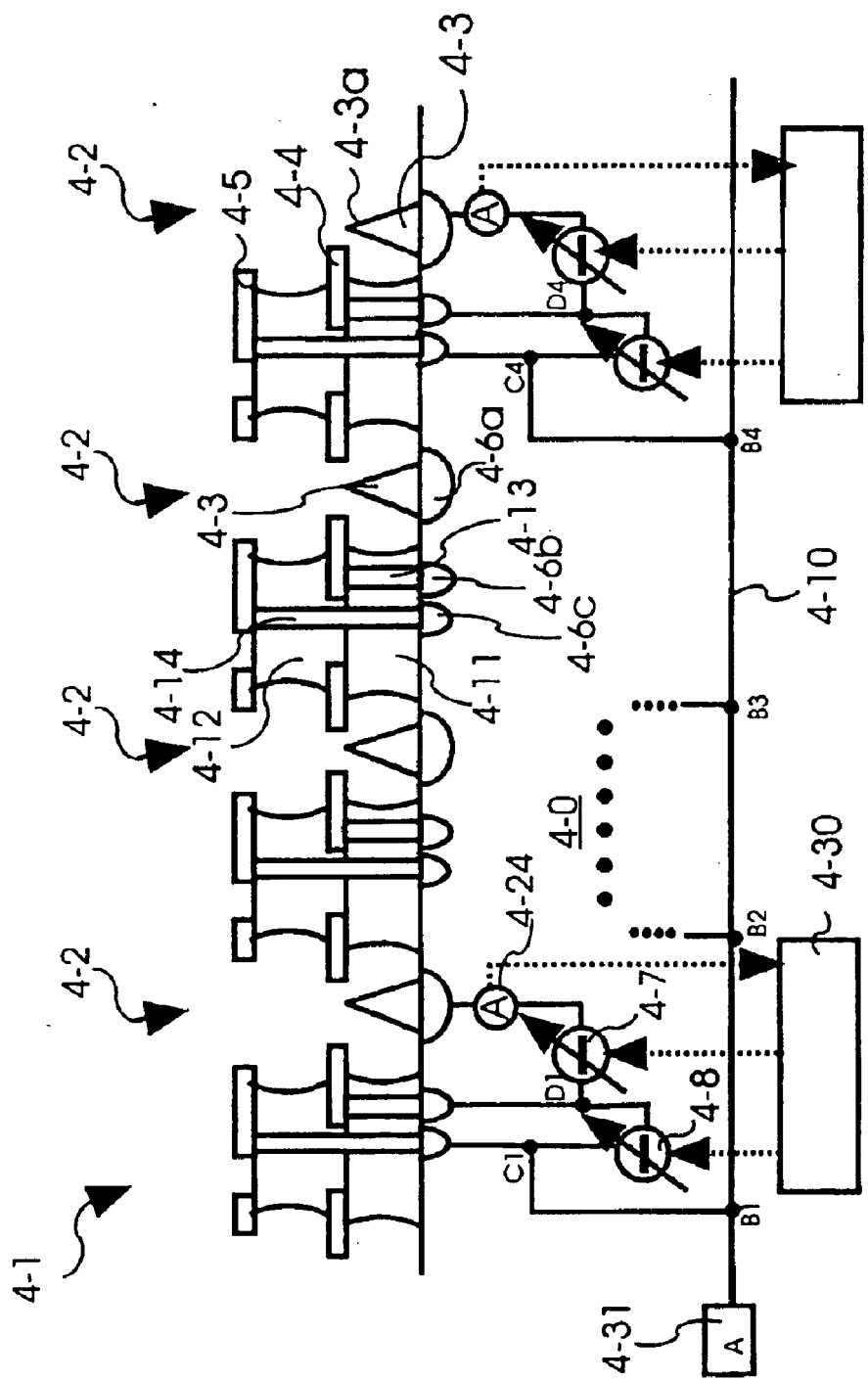
FIG. 4a shows a cross sectional view of an embodiment according to the invention with an array of field emitter beam sources integrated onto a substrate.

FIG. 4a shows schematically a cross section of an array of field emitter beam sources 4-1 with the field emitter beam sources 4-2 integrated onto a substrate 4-0. Preferably the substrate is silicon in order to be able to integrate microelectronic circuitry onto the substrate. Also schematically shown is the array of control circuits 4-30 controlling the voltages of the $1^{st}$ voltage source 4-7, the $2^{nd}$ voltage source 4-8 and sensing the current values of currents flowing to the field emitter beam sources 4-2 as measured by the current sensing unit 4-24. Such an array of field emitter beam sources 4-1 can be used for a focussing electron beam device as shown in FIG. 3b.

The emitters 4-3, extraction electrodes 4—4 and the focussing anodes 4-5 have been fabricated onto the substrate surface 4-9 of the silicon substrate by well-known micromechanical thin film deposition and etch techniques. The micromechanical thin film techniques allow structures like sharp emitter tips 4-3a for the emitters 4-3, extraction electrodes 4—4 and focussing anodes 4-5 with a precision down to the micrometer range or below to be generate. The high precision helps to generate emitter arrays with homogeneous shape and positioning. A homogeneous shape is important to be able to fabricate field emitter beam source arrays 4-1 with a homogeneous electron beam current distribution.

The field emitter beam sources shown in FIG. 4a are manufactured mainly by depositing and etching layers of insulating or conducting materials with various methods. As a result an array of field emitter beam source 4-2 can be created with emitters 4-3 having their sharp emitter tips 43a surrounded by a first insulating material 4-11 and the extraction electrodes 4—4. The emitter 4-3 is further surrounded by a second insulating material 4-12 and the focussing anode 4-5. The radius of the emitter tip 4-3a is typically in the range of 1 nm to 100 nm, the openings of the extraction electrode and focussing anodes above the emitter 4-3 are in the range of 0.5 $\mu$m to 5 $\mu$m. The small distance between emitter tip 4-3a and extracting electrode 4—4 and the small emitter tip radius make it possible to generate electron emission rates on the nA or even $\mu$A scale with extracting electrode voltages smaller than 100 V. More details about materials and typical dimensions of the arrays are described e.g. in U.S. Pat. No. 5,717,278 and U.S. Pat. No. 5,986,388.

The extraction electrodes 4—4 and the focussing electrodes 4-5 are segmented in order to be able to apply individual voltages for each field emitter beam source. That is also why extraction electrode 4—4 and focussing anode 4-5 of each emitter have individual connections to the extraction electrode contact 4-6b or focussing anode contact 4-6c on the surface 4-9 of the substrate 4-0. The extraction electrode 4—4 is connected to the extraction electrode contact 4-6b through the extraction electrode via 4-13, and the focussing anode 4-6 is connected to the focussing anode contact 4-6c through the focussing anode via 4-12.

The electronics represented by the control circuits 4-30, the cable tree 4-10, the $1^{st}$ and $2^{nd}$ voltage sources 4-7 and 4-8, and the current sensing units 4-24 correspond to the circuit design shown in FIG. 3b. Node A in FIG. 4a is the node to be connected with the $2^{nd}$ anode or the specimen (both not shown in this figure). The current sensing units 4-24 are each positioned between emitter 4-3 and conducting line connecting extraction electrode 4—4 with the focussing anode 4-5. The $2^{nd}$ voltage source 4-8 is positioned between the extraction electrode 4—4 and focussing anode 4-5. The $1^{st}$ voltage source 4-7 is positioned between emitter 4-3 and the conducting line connecting the extraction electrode 4—4 with the focussing anode 4-5.

The first voltage V1 in this example is determined by the voltage of the $1^{st}$ voltage source 4-7, the second voltage V2 is given by the sum of the voltages of the $1^{st}$ voltage source 4-7 and the $2^{nd}$ voltage source 4-8. The currents measured by the current sensing units 4-24 are preferably the currents flowing through the emitter 4-3.

The electronic design is preferably fully integrated onto the substrate 4-0. The integration of the electronic design onto the substrate 4-0 can be done with standard microelectronic fabrication techniques, e.g. a CMOS-process technology. The higher the package density of the field emitter beam sources needed for an application, the higher the package density has to be for the electronic design. Otherwise it is difficult to fit control circuit 4-30 with $1^{st}$ and $2^{nd}$ voltage sources, 4-7 and 4-8, into the available space.

As mentioned before, current sensing unit 4-24 and $1^{st}$ voltage source 4-7 can be replaced by a current source. Preferably the current source comprises a transistor where the drain (or collector) is connected to the emitter. This is one way of generating a current source with very few components. Having few components per field emitter beam source allows for a high integration density of field emitter beam sources onto the substrate.

Figure 4B:
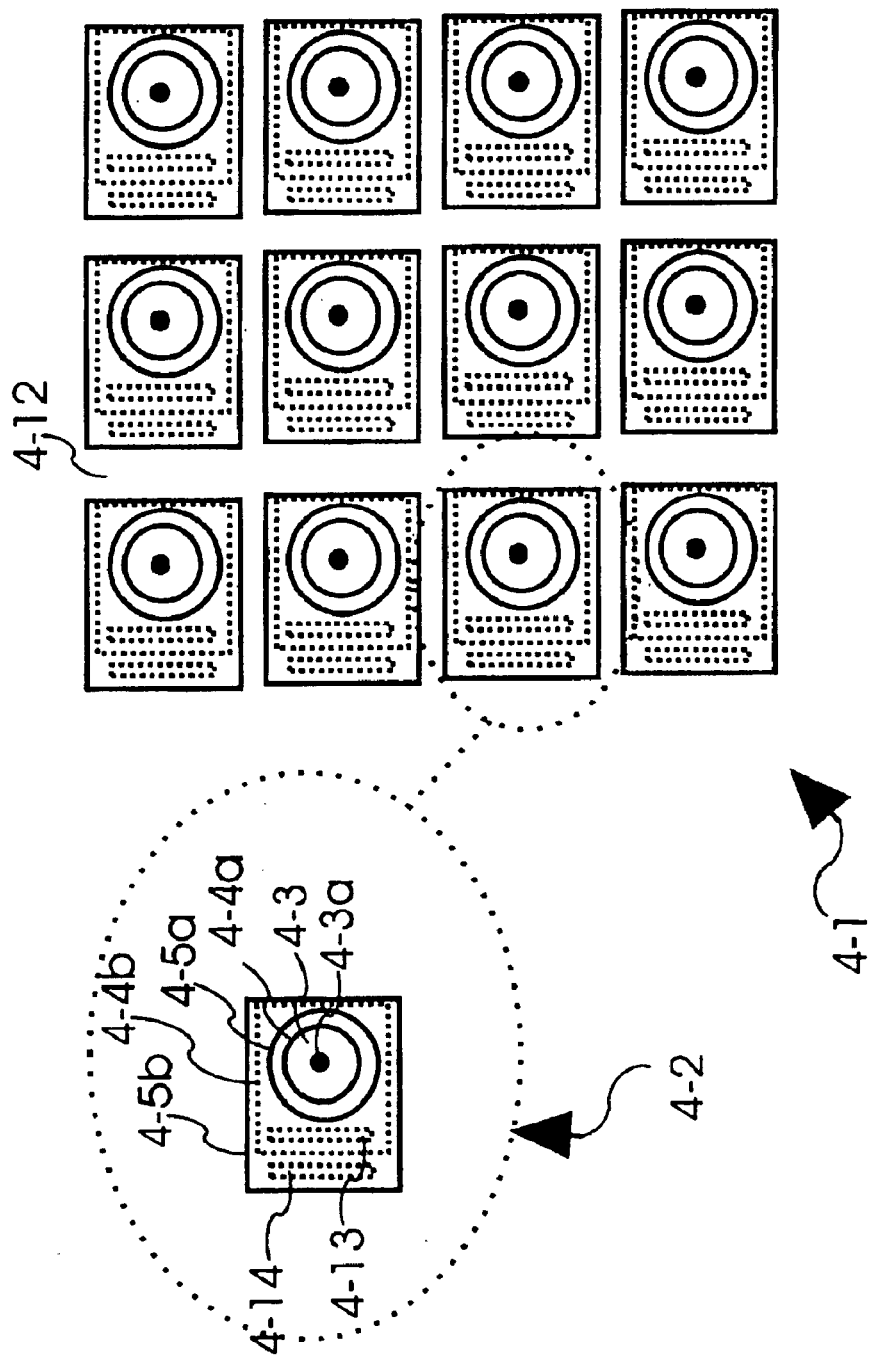
FIG. 4b shows the same array of field emitter beam sources as in FIG. 4a seen from above.

FIG. 4b shows the same array of field emitter beam sources as seen from above. Each field emitter beam source has a circular emitter 4-3 with an emitter tip 4-3a on top. The closest electrode to the emitter tip 4-3a is preferably the extracting electrode whose area is enclosed between the inner border of the extraction electrode 4—4a and the outer border of the extraction electrode 4—4b. The inner border of the extracting electrode layer 4—4a surrounds the emitter tip 4-3a preferably symmetrically and circular in order to make the emitter emit an electron beam in the direction of the optical axis of the electron beam device, which is preferably vertical to the plane of the array of field emitter beam sources 4-1. Further away from the emitter tip is seen the inner border of the focussing anode layer 4-5a which can be seen, when viewed from above, also surrounds the emitter tip 4-3a preferably symmetrically and circular. The dashed lines in FIG. 4b indicate that those lines are not visible when seen from above.

The focussing anode 4-5 and the extracting anodes preferably are both segmented in order to be able to apply individual voltages with respect to each emitter 4-3. This way the electron beam current values and focussing positions can be individually adjusted. The outer border of the extracting electrode layer 4—4b and the outer border of the focussing anode layer 4-5b both extend further to one side in order to provide space for the extraction electrode via 4-13 and the focussing anode via 4-14 which both make contact to the control circuit (not visible).

The pitch between neighboring emitters 4-3 can be chosen anywhere between the size of the chip to less than a micrometer and depends on the application. The distances between the emitter tip 4-3a and inner border of the extraction electrodes 4—4a are usually chosen to be small in order to generate high electric fields (and therefore sufficient electron beam currents) with a low voltage. Low voltages between emitter and extraction electrodes make the design of the control circuit on the substrate easier.

FIG. 4a and FIG. 4b represent only one embodiment of many different ways to fabricate arrays of field emitter beam sources with the respective electronics onto a substrate. This embodiment therefore is meant to be non-limiting. The focussing electron beam device according to the invention is independent of the way that the field emitter beam source or the control circuit is linked together.

Figure 5:
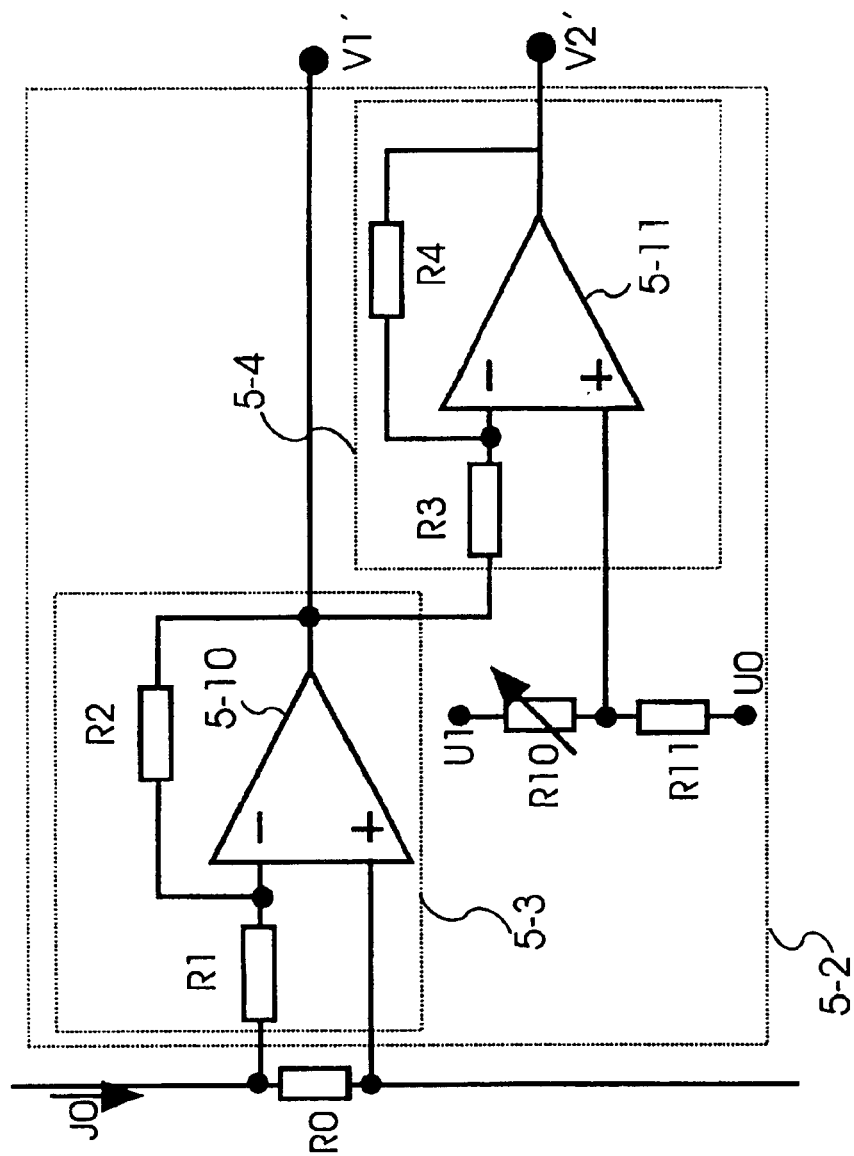
FIG. 5 shows an embodiment according to the invention with a control circuit connected to a current sensing unit.

FIG. 5 shows an example of a control circuit controlling the first voltage V1 and the second voltage V2 for the adjustments of the actual current values to a desired current value and the adjustment of the actual focus positions to a desired focus position. In this embodiment, deviations of the actual current value J0 from a desired current value of the electron beam are sensed as voltage deviations across the resistor R0. The current J0 is preferably the current flowing to the emitter for emission. The voltage deviation is amplified and inverted by the first negative feedback voltage amplifier 5-3 with the first operational amplifier 5-10 and the resistors R1 and R2. The gain, g1, of the first negative feedback voltage amplifier 5-3 is given by the negative ratio of the resistors R1 and R2, i.e. $g1=-R2/R1$. The output of the first operational amplifier, the first correction voltage $V1'=g1 \times R0 \times J0$, serves to reduce the first voltage V1 between emitter and extracting electrode (not shown) and to adjust the actual current value to the desired current value.

At the same time the output of the first negative feedback voltage amplifier 5-3 is used as input for a second negative feedback voltage amplifier 54. The second negative feedback voltage amplifier 5-4 comprises the second operational amplifier 5-11 and the resistors R3 and R4. The gain, g2, of the second negative feedback voltage amplifier 5-2 is given, again, by the negative ratio of the resistors R3 and R4, i.e. $g2=-R4/R3$. The second negative feedback voltage amplifier 5-4 generates a second correction voltage, $V2'=g2 \times g1 \times R0 \times J0$ that can be used to increase the second voltage V2. The gains of both feedback voltage amplifiers, 5-4 and 5-3, are such that the second correction voltage V2' compensates the focus position shift induced by the first correction voltage V2'.

The predetermined algorithm for changes of the second voltage V2 according to changes of the first voltage V1, in the embodiment as shown in FIG. 5, is defined by the gain, g2, and the reference voltage at the positive input of the second operation amplifier 5-11. The reference voltage, in FIG. 5, is predetermined by the voltage divider between the voltages U1 and U0, whereby the voltage divider is made up of the resistors R10 and R11.

The control circuit shown in FIG. 5 is only one embodiment of many other control circuits that can be thought of by a person skilled in the art of solving the problem of adjusting actual current values to a desired current values and of adjusting actual focus positions to desired focus positions. In particular, also digital control circuits can be used to solve the problem. Digital control circuits offer the possibility to perform nonlinear corrections for the adjustments and to implement stored data to the control circuit. Reloadable stored data offer high flexibility for changes of the predetermined algorithm during the life time of the electron beam device.

What is claimed is:

1. A focussing electron beam device, comprising:
   a field emitter beam source with an emitter and an extraction electrode to generate an electron beam;
   at least one anode capable of accelerating the electrons of the electron beam towards a specimen;
   focussing components capable of focussing the electron beam onto the specimen;
   a control circuit sensing for deviations of an actual current value of the electron beam from a desired current value;
   the control circuit controlling a first voltage V1 between the emitter and the extraction electrode to adjust the actual current value of the electron beam to the desired current value; and
   the control circuit controlling a second voltage V2 to adjust an actual focus position of the electron beam to a desired focus position.

2. The focussing electron beam device according to claim 1, whereby the control circuit adjusts the second voltage V2 according to changes of the first voltage V1 with a predetermined algorithm.

3. The focussing electron beam device according to claim 1, whereby the sensing for deviations of the actual current values from the desired current values is performed in time intervals smaller than one second and preferably smaller than one millisecond.

4. The focussing electron beam device according to claim 1, whereby the control circuit adjusts the first voltage V1 in time intervals smaller than one second and preferably smaller than one millisecond.

5. The focussing electron beam device according to claim 1, whereby the control circuit adjusts the second voltage V2 in time intervals smaller than one second and preferably smaller than one millisecond.

6. The focussing electron beam device according to claim 1, whereby the second voltage V2 is applied between the emitter and the at least one anode.

7. The focussing electron beam device according to claim 1 whereby the second voltage V2 is a set of second voltages being applied between the emitter and more than one anode.

8. The focussing electron beam device according to claim 7, whereby at least one voltage of the set of the second voltages is applied to a focussing component of the electron beam device.

9. The focussing electron beam device according to claim 1, whereby one anode is positioned between the field emitter beam source and focussing components.

10. The focussing electron beam device according to claim 1, whereby one of the at least one anode is capable of serving as a support structure for the specimen on which the electron beam is focussed.

11. The focussing electron beam device according to claim 1, whereby the field emitter beam source is replaced by an array of field emitter beam sources capable of generating an array of electron beams.

12. The focussing electron beam device according to claim 11, wherein the focussing electron beam device comprises focussing components common to all electron beams of the array of electron beam sources.

13. The focussing electron beam device according to claim 11, wherein each field emitter beam source of the array of field emitter beam sources comprises a separate control circuit to control the first voltages V1 individually.

14. The focussing electron beam device according to claim 11, wherein the actual current values of the electron beams of the array of field emitter beam sources are adjusted to the same current value.

15. The focussing electron beam device according to claim 11, wherein each field emitter beam source of the array of field emitter beam sources comprises a separate control circuit to control the second voltages V2 individually.

16. The focussing electron beam device according to claim 11, wherein the array of field emitter beam sources is integrated onto a substrate.

17. The focussing electron beam device according to claim 16, wherein active electronic components of the control circuits are integrated onto the substrate.

18. A focussing electron beam device, comprising:
an array of field emitter beam sources to generate an array of electron beams;
wherein each field emitter beam source comprises an emitter and an extraction electrode;
at least one anode capable of accelerating the electrons of the electron beams towards a specimen;
focussing components capable of focussing the electron beams onto the specimen;
control circuits sensing for deviations of actual current values of the electron beams from desired current values;

the control circuits controlling first voltages V1 between the emitter and the corresponding extraction electrode to adjust the actual current values of the electron beams to the desired current values; and
the control circuits controlling second voltages V2 to adjust actual focus positions of the electron beams to desired focus positions.

19. Method for controlling an electron beam comprising the following steps:
a) generating an electron beam with a field emitter beam source;
b) accelerating the electrons of the electron beam towards a specimen;
c) focussing the electron beam to a desired focus position;
d) sensing for deviations of the actual current value of the electron beam from a desired current value using a control circuit;
e) adjusting the actual current value of the electron beam to the desired current value by changing a first voltage V1 through the control circuit; and
f) adjusting an actual focus position of the electron beam to the desired focus position by changing a second voltage V2 through the control circuit.

20. Method for controlling the electron beam according to claim 19, wherein the first voltage V1 is applied between an emitter and an extraction electrode which are both part of the field emitter beam source.

21. Method for controlling the electron beam according to claim 19, wherein the second voltage V2 is adjusted according to changes of the first voltage V1 with a predetermined algorithm.

22. Method for controlling the electron beam according to claim 19, wherein the sensing for deviations of the actual current values from the desired current values is performed in time intervals smaller than one second and preferably smaller than one millisecond.

23. Method for controlling the electron beam according to claim 19, wherein the first voltage V1 is adjusted in time intervals smaller than one second and preferably smaller than one millisecond.

24. Method for controlling the electron beam according to claim 19, wherein the second voltage V2 is adjusted in time intervals smaller than one second and preferably smaller than one millisecond.

25. Method for controlling the electron beam according to claim 19, wherein the second voltage V2 is applied between the emitter and the at least one anode.

26. Method for controlling the electron beam according to claim 19, wherein the current values of the electron beams are sensed in conductors connecting at least one anode with the field emitter beam source.

27. Method for controlling the electron beam according to claim 19, wherein the second voltage V2 is a set of second voltages being applied between the emitter and more than one anode.

28. Method for controlling the electron beam according to claim 27, wherein at least one voltage of the set of second voltages is applied to focussing components of the electron beam device.

29. Method for controlling the electron beam according to claim 19, wherein the field emitter beam source is replaced by an array of field emitter beam sources capable of generating an array of electron beams.

30. Method for controlling electron beams according to claim 29, wherein the electron beams of the array of electron beams are focussed by common focussing components.

31. Method for controlling electron beams according to claim 29, wherein the first voltages V1 of the array of field emitter beam sources are controlled individually.

32. Method for controlling electron beams according to claim 29, wherein the actual current values of the array of electron beams are adjusted to a common desired current value.

33. Method for controlling electron beams according to claim 29, wherein the second voltages V2 of the focussing electron beam device with an array of field emitter beam sources are controlled individually.

34. Method for controlling electron beams according to claim 29, wherein the array of field emitter beam sources is integrated onto a substrate.

35. Method for controlling electron beams according to claim 34 wherein active electronic components of the control circuits are integrated onto the substrate.

36. Method for controlling an array of electron beams comprising the following steps:

a) generating an array of electron beams with an array of field emitter beam sources;

b) accelerating the electrons of the electron beams of the array of electron beams towards a specimen;

c) focussing the electron beams of the array of electron beam sources to desired focus positions;

d) sensing for deviations of the actual current values of the electron beams from desired current values using control circuits;

e) adjusting the actual current values of the electron beams to the desired current values by changing first voltages V1 through the control circuits; and f) adjusting actual focus positions of the electron beams to the desired focus positions by changing second voltages V2 through the control circuits.

* * * * *